US009842978B1

(12) United States Patent
Salvador et al.

(10) Patent No.: US 9,842,978 B1
(45) Date of Patent: Dec. 12, 2017

(54) VEHICLE INCLUDING THERMOELECTRIC GENERATOR

(71) Applicant: GM GLOBAL TECHNOLOGY OPERATIONS LLC, Detroit, MI (US)

(72) Inventors: James R. Salvador, Royal Oak, MI (US); Dale F. Klein, Hartland, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 0 days.

(21) Appl. No.: 15/271,893

(22) Filed: Sep. 21, 2016

(51) Int. Cl.
| H01L 35/30 | (2006.01) |
| B60K 11/02 | (2006.01) |
| B60H 1/00 | (2006.01) |
| B60H 1/04 | (2006.01) |
| B60K 6/22 | (2007.10) |

(52) U.S. Cl.
CPC ......... *H01L 35/30* (2013.01); *B60H 1/00021* (2013.01); *B60H 1/04* (2013.01); *B60K 6/22* (2013.01); *B60K 11/02* (2013.01); *B60H 2001/002* (2013.01); *B60Y 2200/92* (2013.01); *B60Y 2400/206* (2013.01); *Y10S 903/904* (2013.01)

(58) Field of Classification Search
CPC ........... F02B 63/04; H01L 35/00; H01L 35/34
See application file for complete search history.

(56) References Cited

U.S. PATENT DOCUMENTS

| 5,407,130 | A | * | 4/1995 | Uyeki | ................ B60H 1/00492 165/42 |
| 5,901,572 | A | * | 5/1999 | Peiffer | ...................... B60H 1/00 165/104.12 |
| 7,629,530 | B2 | | 12/2009 | Inaoka | |
| 7,878,283 | B2 | * | 2/2011 | Richter | ...................... F02G 5/00 180/68.1 |
| 2004/0221577 | A1 | * | 11/2004 | Yamaguchi | ............. F01N 5/025 60/520 |
| 2005/0247336 | A1 | * | 11/2005 | Inaoka | ................... B60H 1/004 136/205 |
| 2009/0139556 | A1 | * | 6/2009 | Bell | .......................... F01P 9/06 136/201 |
| 2009/0229649 | A1 | * | 9/2009 | Yang | ....................... H01L 35/30 136/201 |
| 2011/0303197 | A1 | * | 12/2011 | Chung | ................. B01D 53/002 123/518 |
| 2013/0333636 | A1 | * | 12/2013 | Geradts | ................... F01N 5/025 123/2 |
| 2016/0099398 | A1 | * | 4/2016 | Lorimer | .................. H01L 35/30 136/201 |

\* cited by examiner

*Primary Examiner* — Erez Gurari

(57) ABSTRACT

A vehicle includes an internal combustion engine (ICE) selectable between a running state and a non-running state. A thermoelectric generator (TEG) is in thermal contact with the ICE for converting thermal energy from the ICE to output electrical energy. The vehicle has an electric pump for circulating a liquid coolant through a coolant circuit. The electric pump is selectively powerable by the electrical energy output from the TEG. The coolant circuit is in fluid communication with the ICE, a radiator, and the TEG; and the TEG is downstream of the radiator in the coolant circuit.

12 Claims, 3 Drawing Sheets

VEHICLE INCLUDING THERMOELECTRIC GENERATOR

TECHNICAL FIELD

The present disclosure relates generally to heating or cooling an internal combustion engine.

BACKGROUND

A thermoelectric module is a semiconductor-based electronic component that may be used for electric power generation. When a temperature differential is applied across a thermoelectric module, DC electric power is generated. As such, a thermoelectric module may be used to convert thermal energy to electrical energy. In other applications, a thermoelectric module may be applied as a heat pump or Peltier cooler.

Internal combustion engines convert, by combustion of fuel, the chemical energy of the fuel into energy useable to do work. Typically, only a portion of the energy released in combustion of the fuel is converted by the internal combustion engine into desirable work. In some internal combustion engines, a significant portion of the energy of combustion is lost in the form of waste heat.

SUMMARY

A vehicle includes an internal combustion engine (ICE) selectable between a running state and a non-running state. A thermoelectric generator (TEG) is in thermal contact with the ICE for converting thermal energy from the ICE to output electrical energy. The vehicle has an electric pump for circulating a liquid coolant through a coolant circuit. The electric pump is selectively powerable by the electrical energy output from the TEG. The coolant circuit is in fluid communication with the ICE, a radiator, and the TEG; and the TEG is downstream of the radiator in the coolant circuit.

BRIEF DESCRIPTION OF THE DRAWINGS

Features of examples of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

DETAILED DESCRIPTION

Examples of the vehicle and method disclosed herein utilize a thermoelectric generator (TEG) to convert thermal energy from the internal combustion engine (ICE) to usable electrical energy. When the ICE is in a running state, thermal energy is produced by the combustion of fuel. At least a portion of the thermal energy produced by the ICE is converted by the TEG to electrical energy, and at least a portion of the electrical energy is used to power an electric pump. The TEG may be in thermal contact with the ICE. For example, the TEG may be in contact with an exhaust system of the ICE. In the present disclosure, the exhaust system of an ICE is a part of the ICE. When the TEG is in thermal contact with the ICE, the liquid coolant cools a cold side of the TEG. The electric pump, selectably powerable by the electrical energy output from the TEG, circulates a liquid coolant through a coolant circuit. The coolant circuit is in fluid communication with the ICE, a radiator, and the TEG.

As used herein, "in thermal contact" means making surface-to-surface contact between bodies such that conductive heat transfer may occur. It is to be understood that a material such as "thermal paste," a brazing material, or a welding material may be disposed between two bodies "in thermal contact." It is not necessary for two bodies in thermal contact to be affixed to each other as long as they are in contact and conductive heat transfer can occur between the two bodies through the contacting surfaces.

Figure 1:
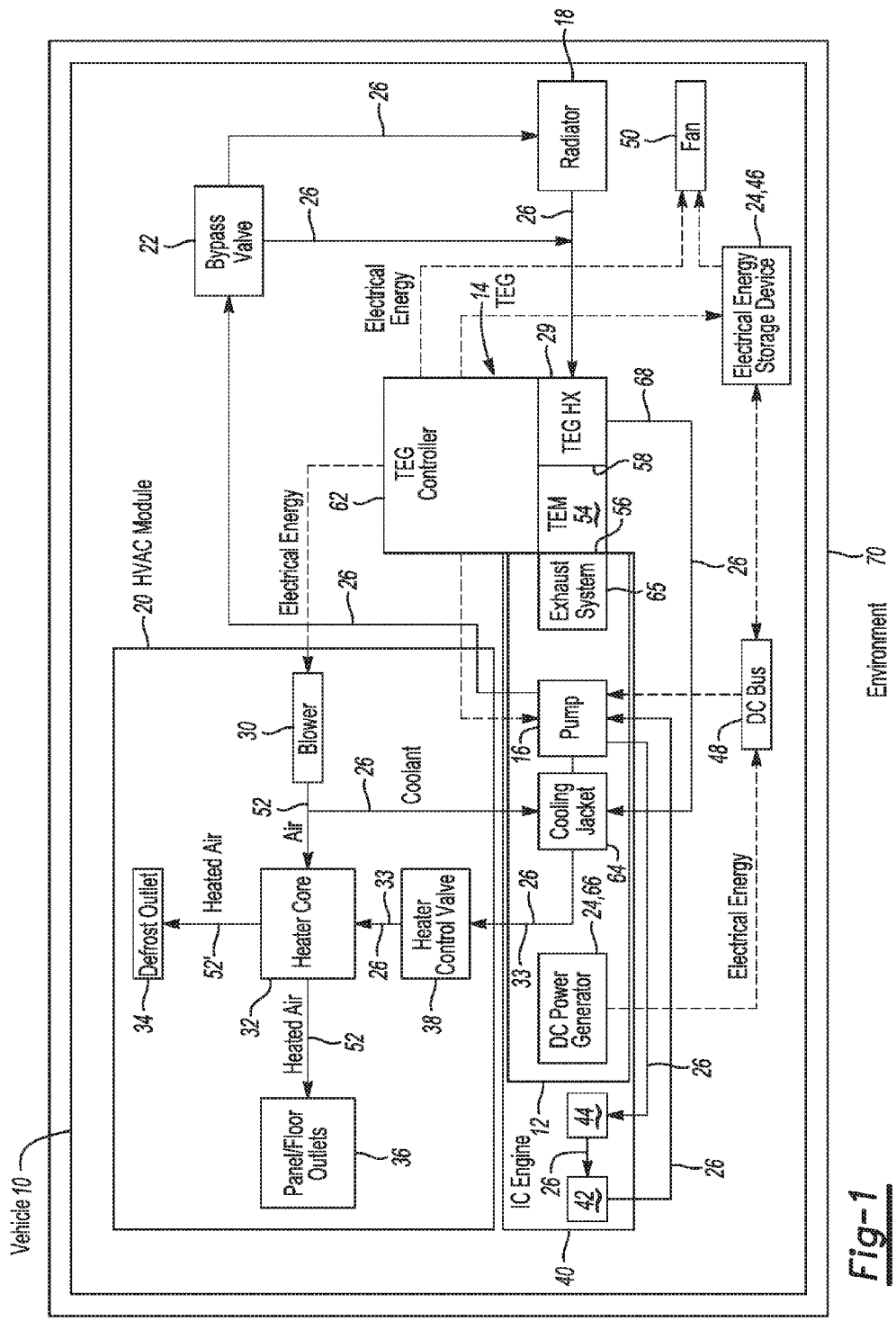
FIG. 1 is a block diagram of an example of the vehicle disclosed herein.

Referring now to FIG. 1, an example of the vehicle 10 of the present disclosure is depicted. The vehicle 10 includes an internal combustion engine (ICE) 12, a thermoelectric generator (TEG) 14, an electric pump 16, and a radiator 18. The vehicle 10 may also include a Heating Ventilation and Air Conditioning (HVAC) module 20, a radiator bypass valve 22, and a source of DC power 24 that is separate and distinct from the TEG 14 (e.g., a DC power generator 66 or an electrical energy storage device 46).

In the example shown in FIG. 1, the ICE 12 and the TEG 14 are in thermal contact, and the ICE 12, the TEG 14, and the radiator 18 are in fluid communication with a coolant circuit 26, with the TEG 14 being downstream of the radiator 18 in the coolant circuit 26. In this example, a portion of the thermal energy produced by the ICE 12 is transferred directly from the ICE 12 to the TEG 14 (e.g., by conduction from the exhaust system 65), and the liquid coolant circulated through the coolant circuit 26 is used to cool the cold side 58 of one or more thermoelectric modules 54 of the TEG 14 (via a liquid cooled heat exchanger 29). In this example, the liquid coolant may receive residual thermal energy 68 from the TEG 14 through the liquid cooled heat exchanger 29.

The ICE 12 may be any engine that generates motive power by causing a combustion reaction with an oxidizer, such as oxygen, and a fuel, such as gasoline or diesel fuel inside the engine. The ICE 12 is selectable between a running state and a non-running state. As used herein, the running state means the combustion reactions are occurring inside the ICE 12. Conversely, the non-running state means the combustion reactions are not occurring inside the ICE 12. The combustion reactions produce gases, such as carbon dioxide and water vapor, which apply force (e.g., to a piston) and produce the motive power. The combustion reaction also produces thermal energy. The combustion products, including exhaust gas are directed away from the ICE 12 by an exhaust system 65 of the ICE 12. The exhaust system 65 may include, for example, an exhaust manifold, catalytic converter, muffler, exhaust pipe, exhaust system connectors, hangers, and sensors attached to the exhaust system. In this disclosure, the exhaust system 65 is included in the ICE 12.

In some existing internal combustion engines, the thermal energy produced by the internal combustion engine is lost to the environment as waste heat. However, in the example of the vehicle 10 shown in FIG. 1, the ICE 12 and the TEG 14 are in thermal contact, and a portion of the thermal energy produced by the ICE 12 is directly transferred to the TEG 14. The portion of the thermal energy that gets transferred to the TEG 14 is converted, at least in part, to useable electrical energy by the TEG 14.

Examples of the liquid coolant circulating through the coolant circuit 26 include mixtures of water and coolant concentrate (antifreeze, an example of which is ethylene glycol) referred to in SAE J814 Engine Coolants, incorporated by reference herein. It is to be understood that the liquid coolant disclosed herein is not limited to water/antifreeze mixtures. For example, liquids including natural and synthetic motor oils, hydraulic fluids and silicone may be used as the liquid coolant. As depicted in FIG. 1, the liquid coolant (via the coolant circuit 26) may flow through the radiator 18 to cool the liquid coolant. Once the liquid coolant is cooled by the radiator 18, the liquid coolant may then cool the ICE 12 and/or a liquid cooled heat exchanger (TEG HX) 29 in thermal contact with the thermoelectric module (TEM) 54. The radiator 18 may be a liquid to air heat exchanger, including a typical automotive radiator. The radiator 18 may have engine coolant flowing therethrough. It is to be understood that heat exchanged from the liquid coolant through the radiator 18 may be transferred directly through tubes and fins (not shown) of the radiator 18, or there may be an intermediate heat exchanger, for example an end-tank cooler (not shown).

In the example of the present disclosure depicted in FIG. 1, the TEG 14 is to convert the thermal energy produced by the ICE 12 to output electrical energy. The TEG 14 includes at least one thermoelectric module 54. Each thermoelectric module 54 has a hot side 56 disposed in thermal contact with the ICE 12 and a cold side 58 distal to the hot side 56. A portion of the thermal energy produced by the ICE 12 is transferred to the hot side 56 of the thermoelectric module(s) 54. Each thermoelectric module 54 converts the thermal energy transferred from the ICE 12 to electrical energy via a Seebeck effect for consumption or storage by the vehicle 10. Electrical energy is depicted with dashed lines in FIG. 1. For example, electrical energy is shown coming out of the TEG controller 62 and being conducted to the fan 50, Pump 16, and the electrical energy storage device 24, 46. A liquid cooled heat exchanger 29 is disposed on the cold side 58 of each thermoelectric module 54 to transfer residual thermal energy from the thermoelectric module 54 to the liquid coolant. The liquid coolant is pumped through the liquid cooled heat exchanger 29 by the electric pump 16 via the coolant circuit 26.

The thermoelectric module 54 may be an array (not shown) of thermoelectric modules 54. The thermoelectric modules 54 in an array may be electrically connected to other thermoelectric modules 54 in the array in series, in parallel, or in a combination thereof.

Non-limiting examples of the thermoelectric module 54 are: the HZ-20 Thermoelectric Module available from Hi-Z Technology, Inc., 7606 Miramar Road, San Diego Calif. 92126-4210; the TG12-6 thermoelectric module available from Marlow Industries, Inc., 10451 Vista Park Rd, Dallas, Tex. 75238; the PowerCard-γ™ available from Alphabet Energy, 26225 Eden Landing Road, Suite D, Hayward, Calif. 94545; and Skutterudite Thermoelectric Modules available from Furukawa Co., Ltd., 1-25-13 Kannondai, Tsukuba, Ibaraki 305-0856, Japan. The TEG 14 may also include a TEG controller 62. The TEG controller 62 may direct the electrical energy generated by the TEG 14 to the electrical load (e.g., the electric pump 16, the electric fan 50, the blower 30, etc.).

In examples of the present disclosure, the TEG 14 may generate electrical energy from thermal energy produced by the ICE 12 while the ICE 12 is in the running state or the non-running state. In an example, the TEG 14 is capable of producing from about 1.5 Wh (Watt hours) to about 15 Wh of electrical energy after the ICE 12 has been switched from the running state to the non-running state.

An example was tested. A TEG was mounted on an exhaust system of a vehicle and the vehicle was subjected to a hard drive cycle to fully warm up the engine and exhaust system. In the tested example of the present disclosure, the TEG produced electrical power at a maximum of 312.85 Watts at time=0 that decayed exponentially to about 6 Watts at time=90 seconds. The time constant was about 22.73 seconds. Integrating the exponential power equation between the limits of 0 and 90 seconds shows that 6975 Watt Seconds (1.938 Watt Hours) of energy was generated in the tested example over the first 90 seconds. 1.938 Wh is sufficient to run a 5 Watt pump for about 23 minutes.

The electrical energy generated by the TEG 14 may be consumed by the electric pump 16. The electric pump 16 circulates the liquid coolant through the coolant circuit 26. The electric pump 16 may be any pump that runs on electrical energy and is capable of circulating the liquid coolant through the coolant circuit 26. In some examples, the electric pump 16 may pump the liquid coolant through a cooling jacket 64 to cool the ICE 12. As used herein, the cooling jacket 64 means a network of passageways defined in the ICE 12 (e.g., in the cylinder block around the cylinders, and in the cylinder head around the combustion chamber) to cool the ICE 12 with the liquid coolant from the coolant circuit 26. As disclosed herein, in examples of the present disclosure, the liquid coolant may be used to keep portions of the ICE 12 warmer than the portions of the ICE 12 would be if the portions of the ICE 12 were allowed to cool without circulation of the liquid coolant.

The electric pump 16 is selectably powerable by the electrical energy output from the TEG 14. The electric pump 16 may be powered by the TEG 14 when the ICE 12 is in the non-running state. The electric pump 16 may also be powered by a source of DC power 24 that is separate and distinct from the TEG 14. The source of DC power 24 may be the DC power generator 66 or the electrical energy storage device 46. Examples of an electrical energy storage device 46 are a chemical battery or a capacitor. The TEG 14 requires a temperature difference between the hot side 56 and the cold side 58 to generate electric power from the TEG 14. Therefore, as used herein, "hot" and "cold" are relative to each other. "Hot" means having a higher temperature than "cold", thereby creating a thermal gradient across the TEG 14 to generate electric power.

In the example shown in FIG. 1, the source of DC power 24 may selectably power the electric pump 16 to prime the TEG 14 with liquid coolant to cool the cold side 58 of the TEG 14 to initiate a generation of electric power by the TEG 14. When the ICE 12 is in the running state, the ICE 12 may supply mechanical work to the DC power generator 66 (e.g., by turning an armature of the DC power generator 66) and the DC power generator 66 may then convert the mechanical work from the ICE 12 to DC power, which may be used to power the electric pump 16. The electrical energy storage device 46 may supply electrical energy to the electric pump 16 when the TEG 14 and the DC power generator 66 cannot supply sufficient electrical energy to power the electric pump 16.

In examples of the present disclosure, the electrical energy generated by the TEG 14 may power an electric fan 50. The electric fan 50 may help the radiator 18 cool the liquid coolant. In an example, the radiator 18 may include a series of thin tubes and/or fins through which the liquid coolant is circulated, allowing the liquid coolant to be cooled by the air surrounding the tubes and/or fins. The electric fan 50 may draw ambient air through the radiator 18 in response to a control signal. The ambient air drawn through the radiator 18 by the electric fan 50 may cool the liquid coolant as the liquid coolant flows through the radiator 18. With forced air convection from the electric fan 50, the radiator 18 may cool the liquid coolant passing through the radiator to a sufficiently low temperature to maintain the ICE 12 and/or other components of the vehicle 10 within operational temperature limits (i.e., under boilover temperature or chemical degradation limits). In some cases, it may be desirable to operate the electric fan 50 when the ICE 12 is in the non-running state to maintain the ICE 12 and/or other components of the vehicle 10 within the operational temperature limits. Thus, the term "operational temperature limits" as used herein does not imply that temperatures are maintained only when a component or the ICE 12 is operating.

The electric fan 50 is selectably powered by the electrical energy output from the TEG 14. The electric fan 50 may be powered by the TEG 14 when the ICE 12 is in the non-running state and natural convection does not provide enough cooling power.

In the example shown in FIG. 1, the electric fan 50 may help the radiator 18 cool the liquid coolant upstream of the liquid cooled heat exchanger 29 via the coolant circuit 26. In the example depicted in FIG. 1, the TEG 14 is downstream of the radiator 18 in the coolant circuit 26. When the ICE 12 is in the running state, the ICE 12 may supply mechanical work to the DC power generator 66 (e.g., by turning an armature of the DC power generator 66), and the DC power generator 66 may then convert the mechanical work from the ICE 12 to DC power, which may be used to power the electric fan 50. The electrical energy storage device 46 may power the electric fan 50 when the TEG 14 and the DC power generator 66 cannot supply sufficient electrical energy to power the electric fan 50 and natural convection does not provide enough cooling power to the radiator 18.

The electrical energy generated by the TEG 14 may also be consumed by a blower 30 of the HVAC module 20. The HVAC module 20 may include, in addition to the blower 30, a heater core 32, a defrost outlet 34, a floor/panel outlet 36, and a heater control valve 38. The blower 30 outputs air 52 through the HVAC module 20. The heater core 32 is disposed downstream of the blower 30 to heat the air 52 from the blower 30. The heater core 32 may be a liquid to air heat exchanger to transfer thermal energy from the liquid coolant to the air 52 output by the blower 30. Thus, the liquid coolant may transport thermal energy from the ICE 12 to the heater core 32. The defrost outlet 34 directs the heated air 52 toward a windshield, a window(s), and/or mirror(s). The floor/panel outlet(s) 36 direct the heated air 52 toward a floor or other location (e.g., toward passenger upper body area) of a passenger compartment of the vehicle 10. The heater control valve 38 selectably regulates the flow of the liquid coolant through a heater core branch 33 of the coolant circuit 26. The heater control valve 38 may be used to block the heater core branch 33 of the coolant circuit 26 to reduce the load on the electric pump 16 by directing the pumping energy to pumping coolant through a smaller volume of the open branches of the coolant circuit 26.

The blower 30 is selectably powerable by the electrical energy output from the TEG 14. The blower 30 may be powered by the TEG 14 when the ICE 12 is in the non-running state. When the ICE 12 is in the running state, the ICE 12 may perform mechanical work on the DC power generator 66 (e.g., by turning an armature of the DC power generator 66) and the DC power generator 66 may then convert the mechanical work from the ICE 12 to DC power, which may be used to power the blower 30. The electrical energy storage device 46 may power the blower 30 when the TEG 14 and the DC power generator 66 cannot supply sufficient electrical energy to power the blower 30.

The electrical energy generated by the TEG 14 may also be stored in the electrical energy storage device 46. The electrical energy storage device 46 may be any electrical energy storage device, such as a chemical battery (e.g., a lead-acid battery, a Nickel Cadmium battery, a Lithium Ion battery, etc.) or a capacitor. The electrical energy storage device 46 may be connected to a DC bus 48. Through the DC bus 48, the electrical energy storage device 46 may receive additional electrical power (e.g., from the DC power generator 66) and may supply electrical power to various components of the vehicle 10 (e.g., the electric pump 16, the electric fan 50, the blower 30, etc.).

Other non-limitative examples of electrical loads that may be powered by the electrical energy generated by the TEG 14 are entertainment systems, lighting, electric motors, solenoids, instruments, navigation systems, and communication systems.

As mentioned above, the vehicle 10 may also include a radiator bypass valve 22. In an example, the radiator bypass valve 22 may be a conventional bimetallic spring thermostat. In other examples, the radiator bypass valve 22 may be operable to open/close under conditions that are in addition to, or instead of a coolant temperature. When the ICE 12 is in the non-running state, the radiator bypass valve 22 may selectably bypass a radiator branch of the coolant circuit 26, in response to a coolant temperature being in a bypass temperature range and selectably open the radiator branch of the coolant circuit 26 in response to the coolant temperature being above a predetermined threshold. The bypass temperature range may be below about 100° C. For example, a conventional bimetallic spring thermostat may begin to open at about 95° C. and be fully open at about 100° C. In some examples, the bypass temperature range may be below a "warmed up" engine temperature of 90° C. In other examples, the bypass temperature may be below a temperature where engine friction drops, for example, about 60° C.

Since engine oil viscosity is typically temperature dependent, the bypass temperature range may depend on the engine oil specification for the engine. Allowing the radiator 18 to cool the ICE 12 to a lower temperature may prolong operation of the TEG 14 by making a greater temperature difference between the exhaust system 65 in the non-running state and the coolant, since the exhaust system 65 will typically cool faster than the engine cylinder block. The engine block (coolant) may be allowed to cool to a lower temperature when the vehicle 10 is parked compared to the vehicle 10 being in a start/stop situation.

A start/stop situation is encountered when the ICE 12 automatically turns off when the vehicle 10 is stopped, for example in traffic. When the driver releases the brake and depresses the accelerator, the ICE 12 automatically restarts. However, the vehicle systems may determine differences between a start/stop situation and the vehicle 10 being parked, for example, by monitoring sensors and switches in the vehicle 10. For example, if the ICE 12 is turned off by the operator, for example by removing a key, or pressing a start/stop button in a keyless vehicle, the vehicle 10 may determine that the vehicle 10 has been parked.

By bypassing the radiator branch of the coolant circuit 26, the radiator bypass valve 22 allows the vehicle 10 to preserve the latent thermal energy produced by the ICE 12, which allows more thermal energy to be transported to the heater core 32. Thus, the heater core 32 may provide more heat to the air 52 from the blower 30. In the example shown in FIG. 1, the radiator bypass valve 22 may bypass the radiator branch of the coolant circuit 26 when there is enough temperature difference across the TEG 14 to generate electrical energy without cooling the liquid coolant in the radiator 18. When the ICE 12 is too hot (e.g., at a temperature above the threshold temperature), the radiator bypass valve 22, by opening the radiator branch of the coolant circuit 26, allows the ICE 12 to be cooled more quickly by rejecting heat into the environment 70 via the radiator 18.

In examples of the present disclosure, the ICE 12 may be part of a hybrid powertrain 40. Although FIG. 1 includes the hybrid powertrain 40, it is to be understood that some examples include the ICE 12, but do not include the electric drive motor 42 or the drive battery 44. Such examples would not be hybrid vehicles. The hybrid powertrain 40 may include, in addition to the ICE 12, an electric motor 42 and a drive battery 44. The electric motor 42 may selectably power at least one drive wheel (not shown) of the vehicle 10. The coolant circuit 26 may be in fluid communication with the electric motor 42 and/or the drive battery 44. Thermal energy from the electric motor 42 and/or the drive battery 44 may be transferred to the liquid coolant circulating within the coolant circuit 26. The liquid coolant may then selectably transport the thermal energy from the electric motor 42 and/or the drive battery 44 to the ICE 12 or the heater core 32. The ICE 12 may be in a non-running state when the electric motor 42 powers at least one drive wheel of the vehicle 10. The TEG 14 may power the electric pump 16 to keep the ICE 12 warmed up and ready to run more cleanly and efficiently when started in a hybrid powertrain 40.

Figure 2A:
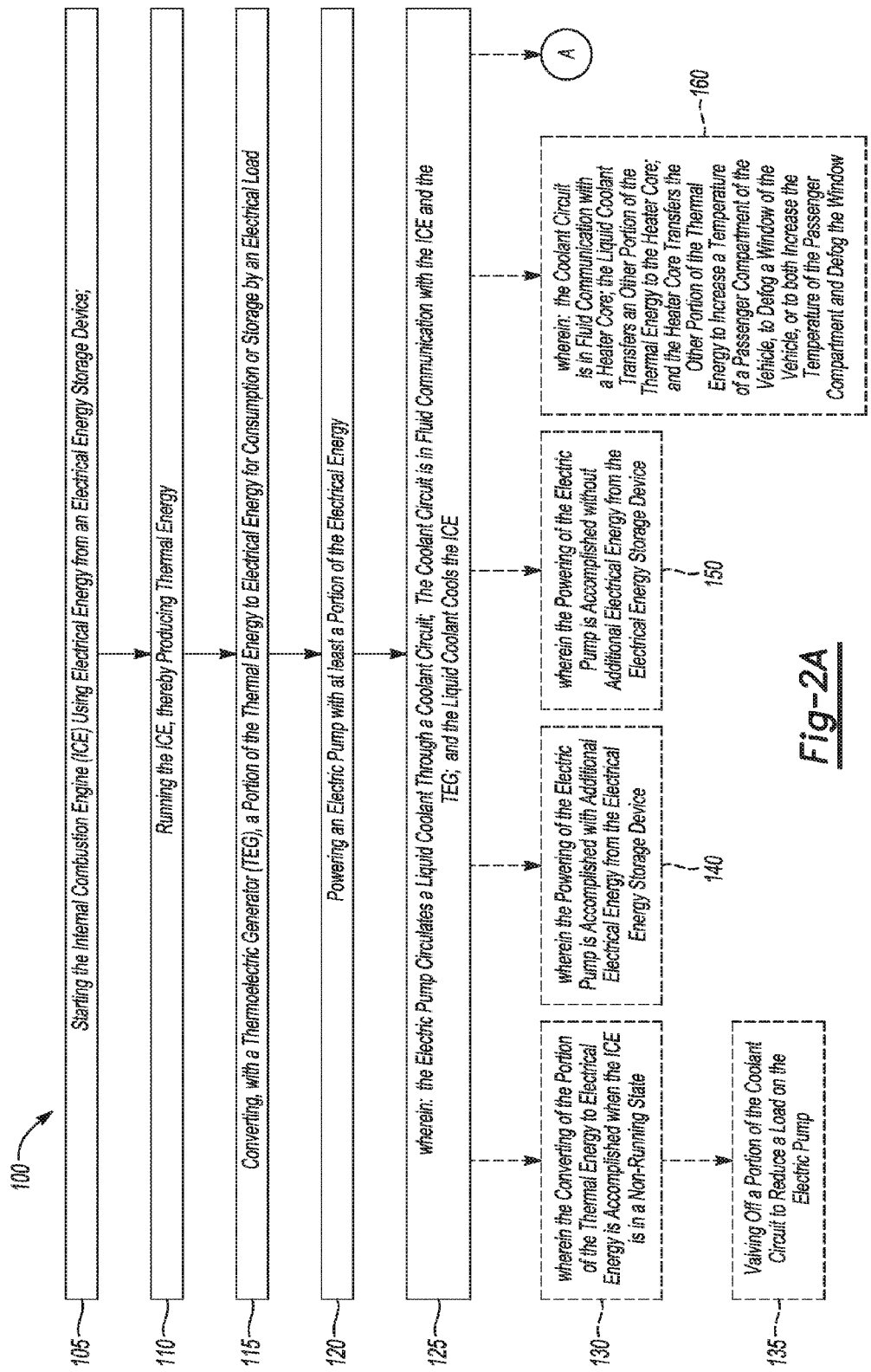
FIG. 2A and FIG. 2B together are a flow chart depicting a method of cooling an internal combustion engine (ICE) of a vehicle as disclosed herein.
Figure 2B:
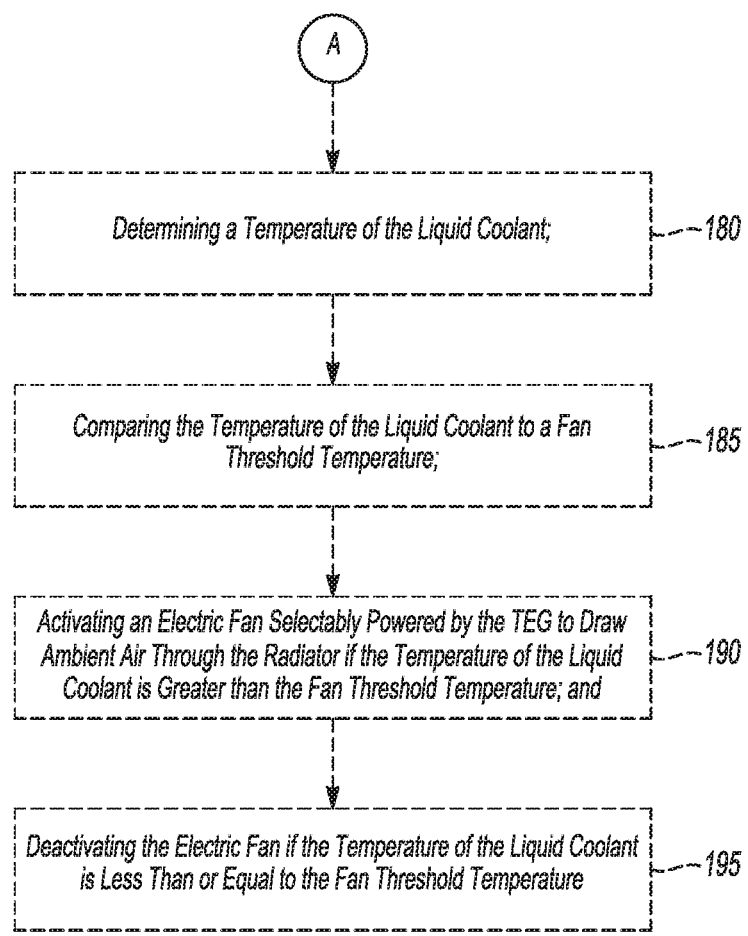

FIG. 2A and FIG. 2B together are a flow chart depicting a method 100 of cooling an internal combustion engine (ICE) of a vehicle as disclosed herein. The method 100 includes "starting the ICE using electrical energy from an electrical energy storage device" as shown the box marked with reference numeral 105. "Running the ICE, thereby producing thermal energy" is at 110. "Converting, with a thermoelectric generator (TEG), a portion of the thermal energy to electrical energy for consumption or storage by an electrical load" is at 115. "Powering an electric pump with at least a portion of the electrical energy" is at 120. "Wherein: the electric pump circulates a liquid coolant through a coolant circuit; the coolant circuit is in fluid communication with the ICE and the TEG; and the liquid coolant cools the ICE" is at 125.

"Wherein the converting of the portion of the thermal energy to electrical energy is accomplished when the ICE is in a non-running state" is at 130. "Valving off a portion of the coolant circuit to reduce a load on the electric pump" is at 135.

"Wherein the powering of the electric pump is accomplished with additional electrical energy from the electrical energy storage device" is at 140. "Wherein the powering of the electric pump is accomplished without additional electrical energy from the electrical energy storage device" is at 150. "Wherein: the coolant circuit is in fluid communication with a heater core; the liquid coolant transfers an other portion of the thermal energy to the heater core; and the heater core transfers the other portion of the thermal energy to increase a temperature of a passenger compartment of the vehicle, to defog a window of the vehicle, or to both increase the temperature of the passenger compartment and defog the window" is at 160. Connector "A" shows how the portion of the flow chart depicted in FIG. 2A is connected to the portion of the flow chart depicted in FIG. 2B.

"Determining a temperature of the liquid coolant" is at 180. "Comparing the temperature of the liquid coolant to a fan threshold temperature" is at 185. "Activating an electric fan selectably powered by the TEG to draw ambient air through the radiator if the temperature of the liquid coolant is greater than the fan threshold temperature" is at 190. "Deactivating the electric fan if the temperature of the liquid coolant is less than or equal to the fan threshold temperature" is at 195.

It is to be understood that, in examples of the present disclosure, the coolant may be used to heat portions of the ICE 12. For example, the TEG 14 may be mounted to the exhaust system 65. Heat from the exhaust system 65 may be transferred to the coolant through the TEG 14. The coolant may then be pumped through the cooling jacket 64 to heat, or slow the rate of cooling, of portions of the ICE 12 in the non-running state.

The method may also cause the ICE 12 to reach a stable operating temperature more quickly than without the TEG 14. In examples, a stable operating temperature for an ICE 12 of the present disclosure is about 90 degrees C. to about 105 degrees C. in the cooling jacket 64.

It is to be understood that the ranges provided herein include the stated range and any value or sub-range within the stated range. For example, a range from about 1.5 Wh to about 15 Wh should be interpreted to include not only the explicitly recited limits of about 1.5 Wh to about 15 Wh, but also to include individual values, such as 1.8 Wh, 10 Wh, 11 Wh, 14 Wh, etc., and sub-ranges, such as from about 1.5 Wh to about 11 Wh, from about 8 Wh to about 12 Wh, from about 10 Wh to about 13 Wh, etc. Furthermore, when "about" is utilized to describe a value, this is meant to encompass minor variations (up to +/−10%) from the stated value.

Further, it is to be understood that the terms connect/connected/connection", "contact/contacting", and/or the like are broadly defined herein to encompass a variety of divergent connected/contacting arrangements and assembly techniques. These arrangements and techniques include, but are not limited to (1) the direct communication between one component and another component with no intervening components therebetween; and (2) the communication of one component and another component with one or more components therebetween, provided that the one component being "connected to"/"in contact with" the other component is somehow in operative communication with the other component (notwithstanding the presence of one or more additional components therebetween).

While several examples have been described in detail, it is to be understood that the disclosed examples may be modified. Therefore, the foregoing description is to be considered non-limiting.

The invention claimed is:

1. A vehicle, comprising:
    an internal combustion engine (ICE) selectable between a running state and a non-running state;
    a thermoelectric generator (TEG) in thermal contact with the ICE for converting thermal energy from the ICE to output electrical energy, the TEG including at least one thermoelectric module having a hot side disposed in thermal contact with the ICE and a cold side distal to the hot side;
    an electric pump for circulating a liquid coolant through a coolant circuit; and
    at least one liquid cooled heat exchanger disposed on the cold side of the at least one thermoelectric module to transfer thermal energy from the at least one thermoelectric module to the liquid coolant pumped through the at least one liquid cooled heat exchanger by the electric pump via the coolant circuit;

wherein:
the electric pump is selectively powerable by the electrical energy output from the TEG;
the coolant circuit is in fluid communication with the ICE, a radiator, and the TEG;
the TEG is downstream of the radiator in the coolant circuit; and
the at least one thermoelectric module converts the thermal energy from the ICE to the electrical energy via a Seebeck effect for consumption or storage by the vehicle.

2. The vehicle as defined in claim 1, further comprising:
a Heating Ventilation and Air Conditioning (HVAC) module having a blower to output air through the HVAC module, a heater core disposed downstream of the blower to heat air from the blower, a defrost outlet to direct the heated air toward a windshield, and a floor outlet to direct the heated air toward a floor of a passenger compartment of the vehicle, wherein:
the heater core is a liquid to air heat exchanger to transfer heat from the liquid coolant to the air output by the blower;
the blower is selectably powerable by the electrical energy output from the TEG when the ICE is in the non-running state; and
a heater control valve selectably regulates a flow of the liquid coolant through a heater core branch of the coolant circuit.

3. The vehicle as defined in claim 1, further comprising:
a radiator bypass valve to, when the ICE is in the non-running state:
selectably bypass a radiator branch of the coolant circuit in response to a coolant temperature being in a bypass temperature range; and
selectably open the radiator branch of the coolant circuit in response to the coolant temperature being above a predetermined threshold.

4. The vehicle as defined in claim 2, further comprising:
a hybrid powertrain including the ICE and an electric motor for selectably powering at least one drive wheel of the vehicle, wherein the coolant circuit is in further fluid communication with the electric motor or a drive battery, wherein the liquid coolant selectably transports thermal energy from the electric motor or the drive battery to the ICE or the heater core.

5. The vehicle as defined in claim 1, further comprising:
a source of DC power separate and distinct from the TEG to selectably power the electric pump to prime the TEG with liquid coolant to cool a cold side of the TEG to initiate a generation of electric power by the TEG.

6. The vehicle as defined in claim 1, further comprising an electric fan selectably powered by the TEG to draw ambient air through the radiator in response to a control signal.

7. A method of cooling an internal combustion engine (ICE) of a vehicle, the method comprising:
starting the ICE using electrical energy from an electrical energy storage device;
running the ICE, thereby producing thermal energy from the ICE;
converting, with a thermoelectric generator (TEG), a portion of the thermal energy from the ICE to electrical energy for consumption or storage by an electrical load; and
powering an electric pump with at least a portion of the electrical energy;
wherein:
the electric pump circulates a liquid coolant through a coolant circuit;
the coolant circuit is in fluid communication with the ICE and the TEG;
the liquid coolant cools the ICE; and
the converting of the portion of the thermal energy from the ICE to electrical energy is accomplished when the ICE is in a non-running state.

8. The method as defined in claim 7, further comprising: valving off a portion of the coolant circuit to reduce a load on the electric pump.

9. The method as defined in claim 7 wherein the powering of the electric pump is accomplished with additional electrical energy from the electrical energy storage device.

10. The method as defined in claim 7 wherein the powering of the electric pump is accomplished without additional electrical energy from the electrical energy storage device.

11. The method as defined in claim 7 wherein:
the coolant circuit is in fluid communication with a heater core;
the liquid coolant transfers an other portion of the thermal energy from the ICE to the heater core; and
the heater core transfers the other portion of the thermal energy from the ICE to increase a temperature of a passenger compartment of the vehicle, to defog a window of the vehicle, or to both increase the temperature of the passenger compartment and defog the window.

12. The method as defined in claim 11, further comprising:
determining a temperature of the liquid coolant;
comparing the temperature of the liquid coolant to a fan threshold temperature;
activating an electric fan selectably powered by the TEG to draw ambient air through a radiator if the temperature of the liquid coolant is greater than the fan threshold temperature; and
deactivating the electric fan if the temperature of the liquid coolant is less than or equal to the fan threshold temperature.

* * * * *

UNITED STATES PATENT AND TRADEMARK OFFICE
CERTIFICATE OF CORRECTION

| | |
|---|---|
| PATENT NO. | : 9,842,978 B1 |
| APPLICATION NO. | : 15/271893 |
| DATED | : December 12, 2017 |
| INVENTOR(S) | : James R. Salvador and Dale F. Klein |

Page 1 of 1

It is certified that error appears in the above-identified patent and that said Letters Patent is hereby corrected as shown below:

In the Specification

Column 1, Line 3, please add the following paragraph between the Title and Technical Field:
--STATEMENT REGARDING FEDERALLY SPONSORED RESEARCH OR DEVELOPMENT
This invention was made with Government support under Government Program No. DE-EE0005432 awarded by the United States Department of Energy. The Government has certain rights in this invention.--

Signed and Sealed this
Twenty-fifth Day of June, 2019

Andrei Iancu
*Director of the United States Patent and Trademark Office*